US 9,641,170 B2

(12) United States Patent
Chou et al.

(10) Patent No.: US 9,641,170 B2
(45) Date of Patent: May 2, 2017

(54) PASS DEVICE WITH BOOST VOLTAGE REGULATION AND CURRENT GAIN FOR VCSEL DRIVING APPLICATIONS

(71) Applicant: COSEMI TECHNOLOGIES, INC., Irvine, CA (US)

(72) Inventors: Wu-Chun Chou, Chandler, AZ (US); Robert Monroe Smith, Phoenix, AZ (US); Iain Ross MacTaggart, Eden Prairie, MN (US); John Joseph Stronczer, Minneapolis, MN (US); Charles Phillip McClay, Fountain Hills, AZ (US)

(73) Assignee: COSEMI TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 14/814,050

(22) Filed: Jul. 30, 2015

(65) Prior Publication Data
US 2016/0294382 A1    Oct. 6, 2016

Related U.S. Application Data

(60) Provisional application No. 62/142,594, filed on Apr. 3, 2015.

(51) Int. Cl.
*H03K 3/00*    (2006.01)
*H03K 17/60*   (2006.01)
(Continued)

(52) U.S. Cl.
CPC ............ *H03K 17/60* (2013.01); *H01S 5/042* (2013.01); *H03F 3/19* (2013.01); *H03F 3/4508* (2013.01); *H03F 3/45475* (2013.01); *H03F 3/50* (2013.01); *H05B 33/08* (2013.01); *H03F 2200/135* (2013.01); *H03F 2200/219* (2013.01); *H03F 2200/303* (2013.01); *H03F 2200/42* (2013.01); *H03F 2200/462* (2013.01);
(Continued)

(58) Field of Classification Search
None
See application file for complete search history.

(56) References Cited

U.S. PATENT DOCUMENTS 3,074,279 A * 1/1963 Morris ................. G01P 15/132
331/181
3,422,288 A * 1/1969 Lam ....................... H03K 3/315
327/115

(Continued)

FOREIGN PATENT DOCUMENTS

EP    2112727 A1    10/2009

OTHER PUBLICATIONS

International Search Report for International Patent Application No. PCT/US2016/025511, mailed Jun. 23, 2016.

*Primary Examiner* — Lincoln Donovan
*Assistant Examiner* — Khareem E Almo
(74) *Attorney, Agent, or Firm* — Loza & Loza, LLP; George L. Fountain

(57) ABSTRACT

A power efficient device for driving a load comprising a low current path and a high current path, wherein the high current path is driven by a first voltage source. In order to accommodate larger turn on voltages of possible load devices while maintaining low power operation, an additional voltage source exceeding the voltage source in the high current path is introduced in the low current path.

19 Claims, 4 Drawing Sheets

(51) Int. Cl.
    *H03F 3/19*     (2006.01)
    *H03F 3/45*     (2006.01)
    *H01S 5/042*     (2006.01)
    *H03F 3/50*     (2006.01)
    *H05B 33/08*     (2006.01)

(52) U.S. Cl.
    CPC ............... *H03F 2200/481* (2013.01); *H03F 2203/45101* (2013.01); *H03F 2203/45116* (2013.01); *H03F 2203/45288* (2013.01)

(56) References Cited

U.S. PATENT DOCUMENTS

| | | | | |
|---|---|---|---|---|
| 3,477,030 | A * | 11/1969 | Hawkins | H03F 1/34 330/289 |
| 5,719,522 | A * | 2/1998 | Saitou | G11O 5/147 323/315 |
| 5,936,986 | A * | 8/1999 | Cantatore | G01N 15/14 372/31 |
| 6,307,660 | B1 * | 10/2001 | Cordell | H04B 10/6911 398/209 |
| 7,969,223 | B1 * | 6/2011 | Gilbert | G06G 7/24 327/346 |
| 2006/0290381 | A1 * | 12/2006 | Bui | G06F 13/4072 326/91 |
| 2011/0019706 | A1 | 1/2011 | Moto et al. | |
| 2012/0146604 | A1 * | 6/2012 | Seki | H02M 3/158 323/282 |
| 2012/0213237 | A1 * | 8/2012 | MacTaggart | H01S 5/0427 372/38.02 |
| 2014/0376582 | A1 | 12/2014 | Kao et al. | |

\* cited by examiner

PASS DEVICE WITH BOOST VOLTAGE REGULATION AND CURRENT GAIN FOR VCSEL DRIVING APPLICATIONS

CROSS REFERENCE TO RELATED APPLICATIONS

This application claims the benefit of U.S. Provisional Application No. 62/142,594, filed Apr. 3, 2015, the entire disclosure of which is incorporated herein by reference.

FIELD OF INVENTION

The subject matter herein generally relates to analog circuits and signals and associated amplification techniques. In particular, the invention relates to an analog circuit suitable for modulating data signals onto a laser or other optoelectronic source.

BACKGROUND OF INVENTION

As data communication rates are increasing to 25 Gigabits per second ("Gbps"), VCSEL ("Vertical Cavity Surface-Emitting Laser") apertures are decreasing to limit circuit parasitics, which in turn increase the VCSEL's circuit impedance and forward operating voltage. At 850 nm ("nanometers") optical wavelengths, the VCSEL forward operating voltage exceeds 2 V ("volts") and approaches 2.5 V. This increased forward voltage creates problems for the driving electronics, which operate within typical supply voltages of 3.3 V over supply voltage tolerance and operating temperature range. For example, typical transistor turn-on and control voltages are in the range of 0.6 to 0.9 V, and when added to the VCSEL forward voltage approach or exceed the 3.3 V nominal supply at low tolerance.

For example, U.S. Pat. No. 8,767,784 B2 ("Mactaggart"), describes a driver for supplying a modulated current to a laser. As described therein, a control device is configured to enable a laser activation switch to operate as an emitter follower that behaves like a current source to provide current to a VCSEL such that substantially all the current flows from the collector to the emitter of the laser activation switch and substantially no current flows to the base of the laser activation switch. However, the operating point of the control device described in Mactaggart may easily approach the power supply voltage and therefore risk railing the feedback amplifier causing the control device to fail to operate in regulation.

Other than relaxing the system supply requirement and increasing the voltage supply requirement and increasing the voltage supply at proportionally higher power dissipation, a brute-force approach would involve utilizing a boost voltage regulator. Such an approach brings an associated inefficiency in the switching power supply components. Also, transistor breakdown of the driving electronic circuits are decreasing with advanced technology necessary for 25 Gbps operation and therefore may preclude a general increase in the supply voltage to accommodate the increasing VCSEL forward voltage.

With respect to VCSELs, two competing factors are at play. In order for VCSELs to operate faster, the forward voltage for VCSELs is increasing. However, in order for circuits to operate faster in general, the operating voltage of the circuit must be reduced. Another critical consideration is power consumption. Raising the supply voltage for the entire driver circuit may impose a significant power consumption penalty.

SUMMARY OF INVENTION

The following presents a simplified summary in order to provide a basic understanding of certain aspects. It is not an extensive overview. Nor is it intended to identity key/critical elements or to delineate the scope. Its sole purpose is to present some concepts in a simplified form as a prelude to the more detailed description that is presented later.

Described herein is a power efficient driver circuit for driving a load comprising a low current path and a high current path, wherein the high current path is coupled to the load, a coupling circuit coupling the high current path and low current path, wherein the coupling circuit stabilizes an operation of the driver circuit, a first voltage source coupled to the high current path and a second voltage source coupled to the low current path, wherein the second voltage source exceeds the first voltage source.

Further described herein is a power efficient regulated amplifier comprising a transconductance amplifier, a first supply voltage, wherein the first supply voltage is applied to the transconductance amplifier, a voltage regulator, which is coupled to an input of the transconductance amplifier and a second supply voltage, wherein the second supply voltage is applied to the voltage regulator, the second supply voltage exceeding the first supply voltage.

Further described here in is a power efficient method for regulating a power driver circuit comprising an amplifier, said method comprising a voltage regulator that detects an output current of an amplifier and provides a low speed input voltage to an input of the amplifier based upon an output current of the amplifier, applying a first supply voltage to the amplifier and applying a second supply voltage to the voltage regulator, wherein the second supply voltage exceeds the first supply voltage.

DETAILED DESCRIPTION

Figure 1:
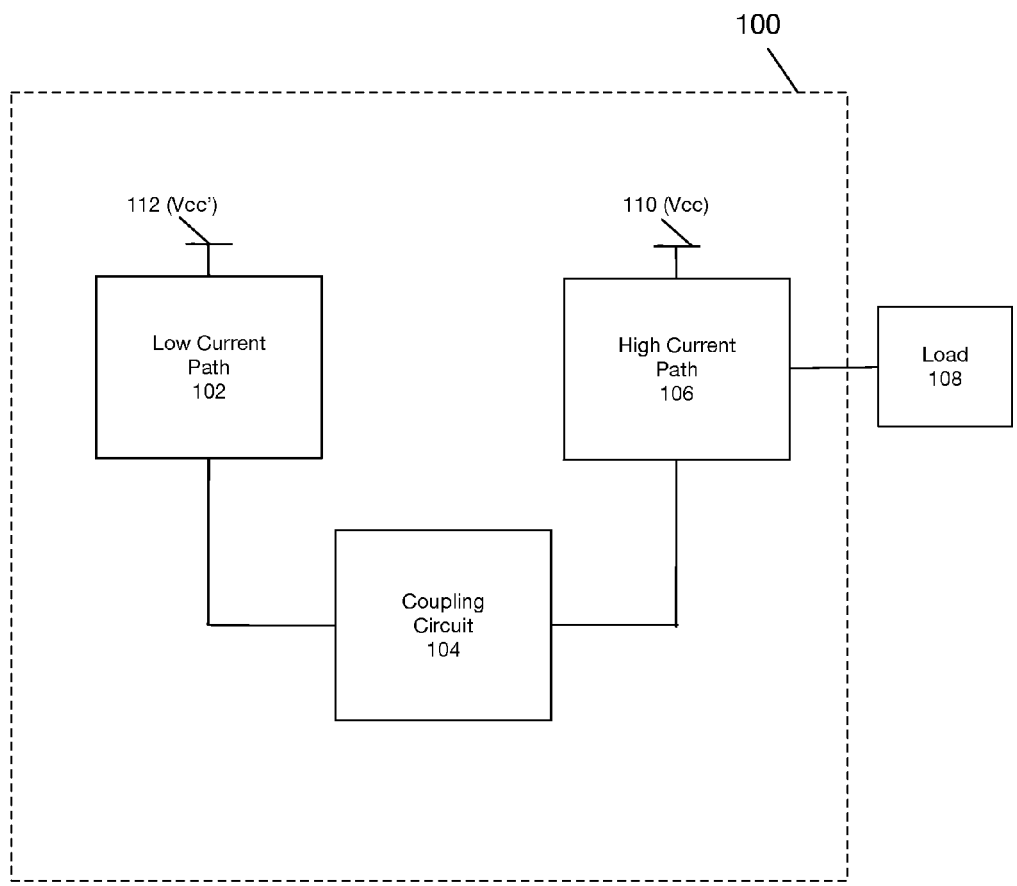
FIG. 1 is a block diagram of a low power driver device according to one embodiment.

FIG. 1 is a general block diagram of a low power driver device 100 according to one embodiment. High current path 106 is coupled to low current path 102 via coupling circuit 104. High current path 106 is also coupled to load 108. According to one embodiment, low current path 102 establishes the operating point of current in high current path 106 via coupling circuit 104. Coupling circuit 104 may, for example, be a feedback circuit.

According to one embodiment, supply voltage 110 (Vcc) is coupled to high current path. Although not depicted explicitly in FIG. 1, elements in low current path may require particular operating or turn on voltages such that the series combination of such elements may approach the supply voltage 110 (Vcc). In particular, it may be necessary to increase the headroom of low current path such that the aggregate voltage of the series combination of elements in low current path does not approach the supply voltage 110 (Vcc). In order to accomplish this, while maintaining a lower power operation, according to one embodiment, as shown in FIG. 1, a second voltage source 112 (Vcc') exceeding voltage source 110 (Vcc) is coupled to low current path. Although Vcc'>Vcc, power dissipation in driver device 110 remains low because voltage source 112 (Vcc') is coupled to low current path 102.

Figure 2:
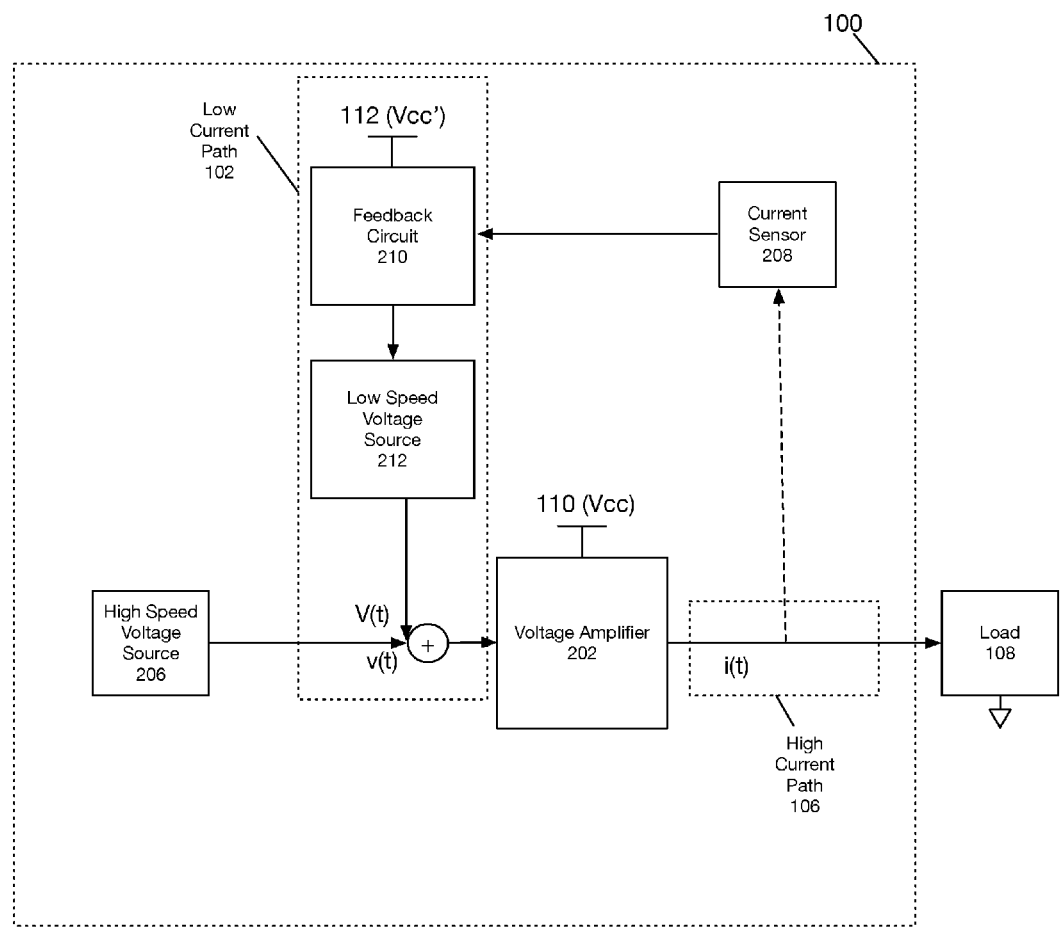
FIG. 2 is a block diagram of an exemplary low power driver device for driving a load according to one embodiment.

FIG. 2 is a block diagram of an exemplary low power driver device 100 for driving a load 108 according to one embodiment. Load 108 may be, for example, a VCSEL or other laser device and may require a large forward operating voltage and may also sink a large current. Thus, as shown in FIG. 2, load 108 is driven via high current path 106. High-speed voltage source 206 provides a high frequency voltage signal such as a communication signal that operates as a modulating voltage signal for load 108.

Voltage amplifier 202 receives a voltage signal as input and generates a voltage signal as output (not shown in FIG. 2). According to one embodiment, voltage amplifier 202 may be a bipolar transistor arranged to operate as an emitter follower. The output node of voltage amplifier 202 acts as a voltage source with an impedance that may vary as a function of temperature and other factors.

It is desired, in another embodiment, that the output node of voltage amplifier 202 act as a current source. The output impedance of voltage amplifier 202 may be increased via current sensor 208 and feedback circuit 210, which operate together to counteract variations in a node voltage of low speed voltage source 212 due to variations in output current i(t). Thus, the introduction of current sensor 208 and feedback circuit 210 operate to fix current i(t) to a constant value such that the output node of voltage amplifier 202 operates as an ideal or near-ideal current source.

According to one embodiment, low speed voltage source 212 may be the supply rail of a differential amplifier. Low speed voltage source 212 generates low frequency voltage V(t), which drives the input of voltage amplifier 202. Thus, as the output current of voltage amplifier 202 varies, so does the output voltage of voltage amplifier 202 and in turn the input voltage at voltage amplifier 202 provided by low speed voltage source 212

Variations in output current i(t) at output of voltage amplifier 202 will result in variation of an input voltage at voltage amplifier 202, which will in turn result in variations of one or more node voltages in low speed voltage source 212. In particular, current sensor 208 may detect a variation in output current i(t) from a known and fixed current source (now shown in FIG. 2) and generate a corresponding voltage signal, which is provided to feedback circuit 210. Correspondingly, feedback circuit 210 outputs a low speed (low frequency) voltage signal, which causes variation in one or more node voltages low speed voltage source 212 thereby counteracting the variation of low speed voltage source 212 due to variation in output current i(t).

Feedback circuit 210 may need to generate a range in voltage amplitudes in order to counteract the swing in node voltages within low speed voltage source 212.

The series combination of voltage drops from load 108 through voltage amplifier 202, low speed voltage source 212 and feedback circuit 210 may approach voltage source 100 (Vcc). This is particularly problematic where feedback circuit 210 must exhibit a large swing in order to counteract operation of low speed voltage source 212 and voltage at the output of feedback circuit 210 approaches the power supply rail. Raising the amplitude of voltage source 110 (Vcc) would destroy the low power operation of voltage driver 110 because in that case the increased voltage source would drive high current path 106 as well as low current path 102.

In order to maintain low power operation while retaining the ability for feedback circuit 210 and low speed voltage source 212 to operate in regulation, a separate voltage source 112 (Vcc') is introduced only in low current path 102, which drives feedback circuit 210 and low speed voltage source 212. This eliminates the problem of approaching the power supply rail while simultaneously providing low power operation of voltage driver 100 since voltage source 112 (Vcc') only drives low current path 102.

Figure 3:
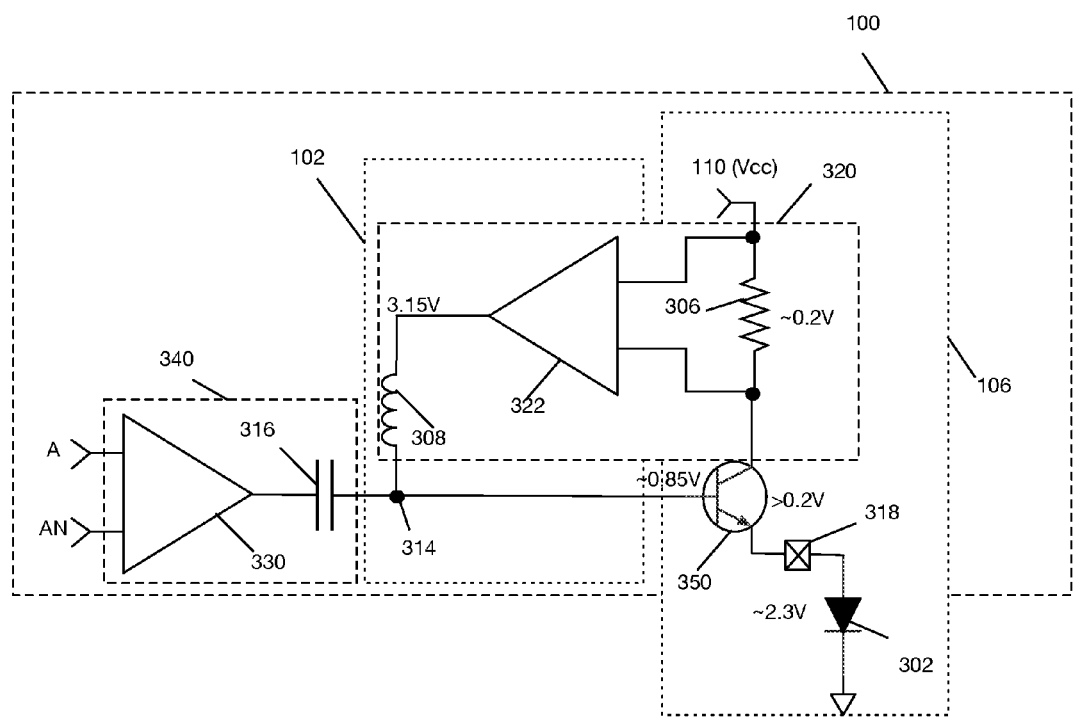
FIG. 3 is a schematic diagram of a low power driver device for driving a load according to one embodiment.

FIG. 3 is a schematic diagram of a low power driver device 100 for driving a load 302 utilizing a single supply voltage source. Load 302 may be a VCSEL or other device and may require a large forward turn-on voltage relative to supply voltage 110 (Vcc). According to one embodiment, driver device 100 may comprise control circuit 320, emitter follower 350 and high-speed voltage source 340.

High-speed voltage source 340 comprises differential pair amplifier 330 and high pass filter 316. According to one embodiment, differential pair amplifier 330 may be implemented using a pair of bipolar transistors in a differential configuration. According to one embodiment, a first communication signal (A) and a second communication signal (AN) are provided to respective inputs of differential pair amplifier 330. The high frequency operation of differential amplifier 330 is indicated by high pass filter 316, which may be a physical capacitor and in general signifies that the output of differential pair amplifier 330 is a high frequency signal. The operation of differential pair amplifier 330 as generating a high frequency signal may, for example, be accomplished based on the modulation scheme utilized for inputs A and AN.

Emitter follower 350 receives a voltage signal as input and generates a voltage signal as output (not shown in FIG. 3). According to one embodiment, emitter follower 350 may be a bipolar transistor. The output of emitter follower 350 acts as a voltage source with an impedance that may vary as a function of temperature and other factors.

Control device 320 operates as a feedback amplifier to cause the output of emitter follower 350 to act as a current source at low frequencies. In particular, control device 320 operates to cause the output of emitter follower 350 to act as a current source by stabilizing and fixing the output current of emitter follower 350.

According to one embodiment, control device 320 comprises sense resistor 306, amplification circuit 322 and low pass filter 308. In particular, resistor 306 of control device 320 is placed in series with the collector of emitter follower 350. Therefore, in operation, substantially all the current flows from the collector to the emitter of emitter follower 350 and substantially no current flows to the base of emitter follower 350. The voltage across resistor 306 thus provides an indication of the current being input into emitter follower 350 and also the current being input into the load 302.

Control device 320 is configured to function at low frequencies. The low frequency operation of control device 320 is indicated by low pass filter 308, which may be a physical inductor and in general signifies that the output of control device 320 and amplifier 322 in particular is a low frequency voltage signal. Specifically, amplifier 322, which may be a voltage gain amplifier, compares the voltage across resistor 306 to a reference voltage (not shown in FIG. 3) and control device 320 may function to maintain this same voltage across resistor 306 by adjusting the output of amplifier circuit 322. Note that, at node 314 output of high frequency voltage source 340 is superimposed upon low frequency voltage source output from control device 320.

FIG. 3 also shows exemplary voltages at various nodes in low power driver device 100. Note that these voltages are merely exemplary and are provided for illustration only. An aggregate series voltage through a first path comprising VCSEL (approx. 2.3V), emitter-collector junction (approx. 0.2V) of emitter follower 350 and through sense resistor 306 (approx. 0.2 V) is approximately 2.7 V. An aggregate series voltage through a second path comprising VCSEL (approx. 2.3 V), base-emitter junction (approx. 0.85 V) to output of amplification circuit 322 is approximately 3.15 V.

With typical supply voltages 110 (Vcc) operating at approximately 3.3 V, the voltage of 3.15 V at the output of amplification circuit 322 leaves very little headroom and raises a significant risk that amplifier circuit 322 will be railed and no longer function in regulation. In the instance where amplification circuit 322 were railed, control device 102 would no longer function as a feedback amplifier as it would be incapable of causing the output current i(t) of emitter follower 350 to rise any higher.

While it might be possible to increase the single supply voltage 110 (Vcc), such a solution would not be practical for high-speed communication devices such as VCSEL 302 because typically high-speed communication devices require lower power supplies and are trending toward even lower power supplies.

Figure 4:
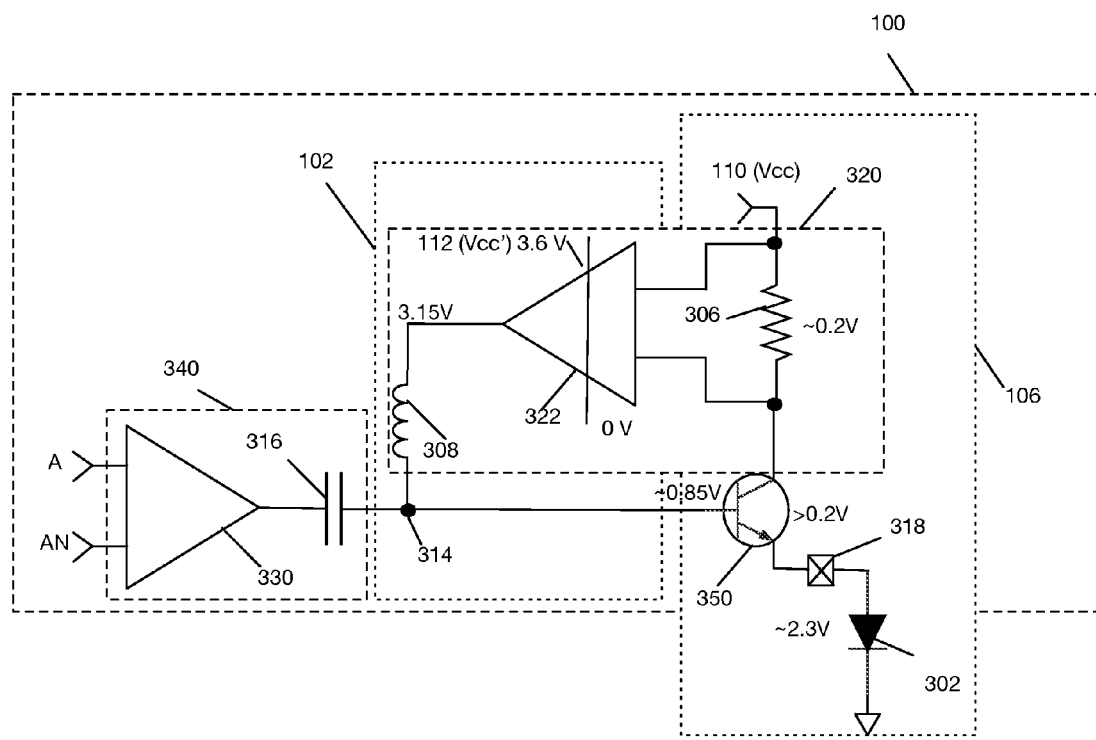
FIG. 4 is a schematic diagram of a low power driver device for driving a load utilizing a first supply voltage source in a high current path and a second voltage source exceeding the first supply voltage source in a low current path.

FIG. 4 is a schematic diagram of a low power driver device 100 for driving a load utilizing a first supply voltage source in a high current path and a second voltage source exceeding the first supply voltage source in a low current path. As shown in FIG. 4, a second power supply voltage 112 (Vcc') is introduced for driving amplification device 322. According to one embodiment, for example, second power supply voltage 112 (Vcc') may be 3.6 V. This provides working headroom to allow control device 320 to continue functioning as a feedback amplifier and maintaining the operation of emitter follower 350 as a current source. Moreover, this approach is highly power efficient since the increased supply voltage 112 (Vcc') only drives low current path 102. In particular, low current path 102 and high current path 106 are driven by respective power supplies 112 (Vcc') and 110 (Vcc). These power supplies operate independently by virtue of the isolation of low current path 102 and high current path 106 and thereby allow power efficient operation of driver device 100 while simultaneously allowing control device to remain in regulation even with larger turn-on voltages required of loads such as VCSEL 302.

What is claimed is:

1. A power efficient driver circuit for driving a load comprising:
   a) a low current path coupled to an input of an amplifier;
   b) a high current path coupled to the load via the amplifier;
   c) a coupling circuit coupling the high current path and low current path, wherein the coupling circuit stabilizes an operation of the driver circuit;
   d) a first voltage source configured to generate a first voltage to produce a high current via the high current path; and
   e) a second voltage source configured to generate a second voltage to produce a low current via the low current path, wherein the second voltage exceeds the first voltage.

2. The power efficient driver circuit according to claim 1, wherein the amplifier comprises a bipolar transistor, and wherein the low current path comprises the low current flow into a base of the bipolar transistor operating as an emitter follower.

3. The power efficient circuit according to claim 2, wherein the high current path comprises the high current flow into the emitter of the bipolar transistor operating as an emitter follower.

4. The power efficient driver circuit according to claim 3, wherein the coupling circuit is a feedback amplifier.

5. The power efficient driver circuit according to claim 4, wherein the feedback amplifier receives a voltage signal generated based upon the high current flow across a resistor.

6. The power efficient driver circuit according to claim 5, wherein the coupling circuit provides a low speed signal to the base of the bipolar transistor.

7. The power efficient driver circuit according to claim 5, further comprising a high-speed signal source, wherein the high speed signal source is coupled to the base of the bipolar transistor.

8. A power efficient regulated amplifier comprising:
   a) a transconductance amplifier;
   b) a first supply voltage, wherein the first supply voltage is applied to the transconductance amplifier;
   c) a voltage regulator, which is coupled to an input of the transconductance amplifier; and
   d) a second supply voltage, wherein the second supply voltage is applied to the voltage regulator, the second supply voltage exceeding the first supply voltage.

9. The power efficient regulated amplifier according to claim 8, wherein the transconductance amplifier comprises an emitter follower.

10. The power efficient regulated amplifier according to claim 9, wherein the emitter follower is an NPN bipolar transistor.

11. The power efficient regulated amplifier according to claim 10, wherein the voltage regulator further comprises a current sensor, which senses an output current signal of the transconductance amplifier and generates a voltage signal based upon the output current signal, which is applied to an input of the transconductance amplifier.

12. The power efficient regulated amplifier according to claim 11, wherein the voltage regulator causes an output of the emitter to operate as an ideal current source.

13. The power efficient regulated amplifier according to claim 11, wherein the voltage regulator is coupled in a feedback arrangement between an output of the transconductance amplifier and the input of the transconductance amplifier.

14. The power efficient regulated amplifier according to claim 11, wherein an output of the voltage regulator is a low speed source.

15. The power efficient regulated amplifier according to claim 14, further comprising a high-speed signal source, wherein the high speed signal source is coupled to a base of the NPN bipolar transistor.

16. A power efficient method for regulating a power driver circuit comprising an amplifier, said method comprising:
   a) providing a voltage regulator that detects an output current of a transconductance amplifier and provides a low speed input voltage to an input of the amplifier based upon an output current of the amplifier;
   b) applying a first supply voltage to the amplifier; and
   c) applying a second supply voltage to the voltage regulator, wherein the second supply voltage exceeds the first supply voltage.

17. The power efficient regulated amplifier according to claim 16, wherein the transconductance amplifier is an emitter follower.

18. The method according to claim 17, wherein the voltage regulator further comprises a current sensor, which senses an output current signal of the transconductance amplifier and generates a voltage signal based upon the output current signal, which is applied to an input of the transconductance amplifier.

19. The method according to claim 17, wherein the voltage regulator causes an output of the emitter to operate as an ideal current source.

\* \* \* \* \*